(12) United States Patent
Aromin

(10) Patent No.: US 7,358,654 B2
(45) Date of Patent: Apr. 15, 2008

(54) PIEZOELECTRIC SWITCH

(75) Inventor: Victor V. Aromin, West Warwick, RI (US)

(73) Assignee: Tower Manufacturing Corporation, Providence, RI (US)

( * ) Notice: Subject to any disclaimer, the term of this patent is extended or adjusted under 35 U.S.C. 154(b) by 118 days.

(21) Appl. No.: 11/225,862

(22) Filed: Sep. 13, 2005

(65) Prior Publication Data
US 2007/0057604 A1 Mar. 15, 2007

(51) Int. Cl.
*H01L 41/08* (2006.01)

(52) U.S. Cl. ...................................... 310/348; 310/328

(58) Field of Classification Search ................ 310/328, 310/348, 358
See application file for complete search history.

(56) References Cited

U.S. PATENT DOCUMENTS

| 4,430,595 | A | | 2/1984 | Nakasone et al. |
| 4,581,506 | A | | 4/1986 | Bai et al. |
| 4,618,797 | A | * | 10/1986 | Cline .......................... 310/339 |
| 4,761,582 | A | | 8/1988 | McKee |
| 5,170,087 | A | | 12/1992 | Karr et al. |
| 5,231,326 | A | | 7/1993 | Echols |
| 5,332,944 | A | | 7/1994 | Cline |
| 5,442,150 | A | | 8/1995 | Ipcinski |
| 5,636,729 | A | | 6/1997 | Wiciel |
| 5,928,150 | A | * | 7/1999 | Call ........................... 600/436 |
| 6,064,141 | A | | 5/2000 | Wiciel |
| 6,466,140 | B1 | * | 10/2002 | McGaffey et al. .......... 340/944 |

FOREIGN PATENT DOCUMENTS

WO     WO-98-36494     *  2/1998

* cited by examiner

*Primary Examiner*—Thomas M. Dougherty
(74) *Attorney, Agent, or Firm*—Kriegsman & Kriegsman

(57) ABSTRACT

A piezoelectric switch includes a piezoelectric element which is electrically connected to a printed circuit board by a pair of wires. A unitary plastic carrier is designed to retain both the piezoelectric element and the printed circuit board fixedly mounted thereon. In turn, the plastic carrier is sized and shaped to be co-axially disposed within the interior cavity of a generally cylindrically-shaped protective housing, wherein the plastic carrier is provided with at least one flexible finger which is configured to snap-fit into engagement within an annular groove formed in the inner surface of the housing so as to retain the carrier in place within the interior cavity. With the carrier fixed in place within the housing, an adhesive spacer disposes the piezoelectric element in contact with the inner surface of a touch plate provided in the housing. Accordingly, in use, the application of a tactile input onto the outer surface of the touch plate in turn causes the approximate center of the piezoelectric element to slightly deform. In response thereto, the piezoelectric element generates an output signal which passes to the printed circuit board. Based on the output signal received, the printed circuit board regulates the state of the piezoelectric switch.

15 Claims, 7 Drawing Sheets

PIEZOELECTRIC SWITCH

BACKGROUND OF THE INVENTION

The present invention relates generally to electrical switches and more particularly to piezoelectric switches.

Piezoelectric switches, also commonly referred to simply as piezo switches, are well known and widely used in the electrical switch industry.

A piezoelectric switch traditionally includes a piezoelectric element comprising a disc-shaped piezoelectric plate and a disc-shaped conductive plate that are affixed together by an adhesive. The piezoelectric plate is commonly constructed out of piezo crystal and serves as the positive terminal for the switch. The conductive plate is typically constructed out of a conductive metal, such as brass, and serves as the negative terminal for the switch. Each of the above-described plates of the piezoelectric element is electrically connected to a printed circuit board which in turn supports the output prongs (i.e., conductive terminals) for the switch.

The piezoelectric element and printed circuit board of a piezoelectric switch are typically mounted within a hollowed out, non-conductive protective housing. Preferably, the housing is provided with an enlarged, button-shaped touch plate which serves as the contact surface for manually regulating the state of the switch. Typically, the piezoelectric plate of the piezoelectric element is affixed to the inner surface of the touch plate using double-sided adhesive tape which is often of a suitable thickness so as to serve as an insulating spacer. Accordingly, it is to be understood that the application of tactile pressure onto the outer surface of the touch plate is transferred to the piezoelectric element which, in turn, causes the piezoelectric element to very slightly deform. In response to its slight deformation, the piezoelectric element generates an electrical signal that is sent to the printed circuit board. If the electrical signal received by the printed circuit board meets a minimum threshold, the printed circuit board in turn switches the state of connection between the pair of output prongs for the switch (i.e., between an open state and a closed state).

An example of a piezoelectric switch is disclosed in U.S. Pat. No. 6,064,141 (hereinafter the '141 patent) which issued on May 16, 2000 in the name of Richard D. Wiciel, said patent being incorporated herein by reference. In the '141 patent there is disclosed a piezoelectric switch that comprises a housing having an inner surface and an outer surface. A piezoelectric element is mounted on the inner surface of the housing. The piezoelectric element has a top layer made of piezo crystal and a bottom layer made of a conductive material such as brass. A printed circuit board is disposed within the housing for controlling the state of the switch, the printed circuit board being electrically connected to the piezoelectric element by an electrical conductor. In one embodiment, the electrical connector is in the form of a flex circuit which has a positive terminal, a negative terminal and a printed circuit board overlay portion that is affixed to the printed circuit board. The flex circuit sandwiches the piezoelectric element therewithin so that the positive terminal contacts the top layer and the negative terminal contacts the bottom layer. In another embodiment, the piezoelectric switch additionally comprises a pushbutton assembly movably mounted on the housing for providing the operator of the switch with a noticeable indication of a change in the state of the switch.

Other known patents of interest include U.S. Pat. No. 4,430,595 which issued on Feb. 7, 1984 in the names of H. Nakasone et al., U.S. Pat. No. 4,761,582 which issued on Aug. 2, 1988 in the name of J. M. McKee, U.S. Pat. No. 5,332,944 which issued on Jul. 26, 1994 in the name of D. J. Cline, U.S. Pat. No. 5,231,326 which issued on Jul. 27, 1993 in the name of J. C. Echols, U.S. Pat. No. 5,442,150 which issued on Aug. 15, 1995 in the name of R. G. Ipcinski, and U.S. Pat. No. 5,636,729 which issued on Jun. 10, 1997 in the name of R. Wiciel, all of said patents being incorporated herein by reference.

Piezoelectric switches of the type as described above offer a number of notable advantages over traditional electrical switches which include, among other things, multiple moving mechanical parts (e.g., pivotable contact arms).

As a first advantage, piezoelectric switches of the type described above include no moving mechanical parts. Because it has been found that moving mechanical parts often falter from use over time, piezoelectric switches are consequently more reliable than traditional, mechanically-based, electrical switches, which is highly desirable.

As a second advantage, piezoelectric switches of the type as described above can be hermetically sealed to protect against harmful environmental conditions (e.g., thermal influences and/or moisture). Specifically, because piezoelectric switches include no moving mechanical parts, the interior cavity of the housing for a piezoelectric switch can be filled with a potting compound, such as a silicon, to protect the electrical components of the switch from corrosive or otherwise damaging elements, which is highly desirable.

Although well known and widely used in commerce, piezoelectric switches of the type as described above have been found to suffer from a notable drawback. Specifically, it has been found that the use of double-sided tape to affix the piezoelectric element to the inner surface of the touch plate can compromise the success rate of the switch in use. In particular, it has been found that operation of a piezoelectric switch is optimized when the application of an input force onto the contact plate in turn deforms the approximate center of the piezo crystal. However, because the entire surface of the piezo crystal is evenly affixed to the inner surface of the contact plate by an adhesive (which may, in turn, weaken over time), the application of an input force onto the housing is just as likely to cause the outer periphery of the piezo crystal to deform as it is to cause the approximate center of the piezo crystal to deform, which is highly undesirable.

SUMMARY OF THE INVENTION

It is an object of this invention to provide a new and improved piezoelectric switch.

It is another object of this invention to provide a new and improved piezoelectric switch that comprises a piezoelectric element mounted within a hollowed-out protective housing.

It is still another object of this invention to provide a piezoelectric switch of the type as described above in which the piezoelectric element is mounted within the protective housing in such a manner so as to optimize the success rate of the switch.

It is yet still another object of this invention to provide a piezoelectric switch of the type as described above which includes a minimum number of parts, which is inexpensive to manufacture and which is easy to use.

Therefore, according to one feature of the present invention, there is provided a piezoelectric switch comprising (a) a housing shaped to define an interior cavity, the housing including a touch plate which comprises an inner surface and an outer surface, the outer surface of the touch plate being accessible for tactile input, (b) a piezoelectric element, the piezoelectric element comprising a piezoelectric plate and a conductive plate, the piezoelectric element being characterized by generating an electrical signal upon its deformation, (c) a printed circuit board assembly, the printed circuit board assembly comprising a printed circuit board that is electrically connected to the piezoelectric element, and (d) a carrier for holding the piezoelectric element, the carrier being separate from the housing, the carrier being sized and shaped to fit within the interior cavity of the housing, (e) wherein the carrier is designed to engage the housing to retain the carrier fixed in place within the interior cavity such that the piezoelectric element is coupled to the inner surface of the touch plate.

Various other features and advantages will appear from the description to follow. In the description, reference is made to the accompanying drawings which form a part thereof, and in which is shown by way of illustration, an embodiment for practicing the invention. The embodiment will be described in sufficient detail to enable those skilled in the art to practice the invention, and it is to be understood that other embodiments may be utilized and that structural changes may be made without departing form the scope of the invention. The following detailed description is therefore, not to be taken in a limiting sense, and the scope of the present invention is best defined by the appended claims.

BRIEF DESCRIPTION OF THE DRAWINGS

The accompanying drawings, which are hereby incorporated into and constitute a part of this specification, illustrate an embodiment of the invention and, together with the description, serve to explain the principles of the invention. In the drawings wherein like reference numerals represent like parts.

DETAILED DESCRIPTION OF PREFERRED EMBODIMENTS

Figure 1:
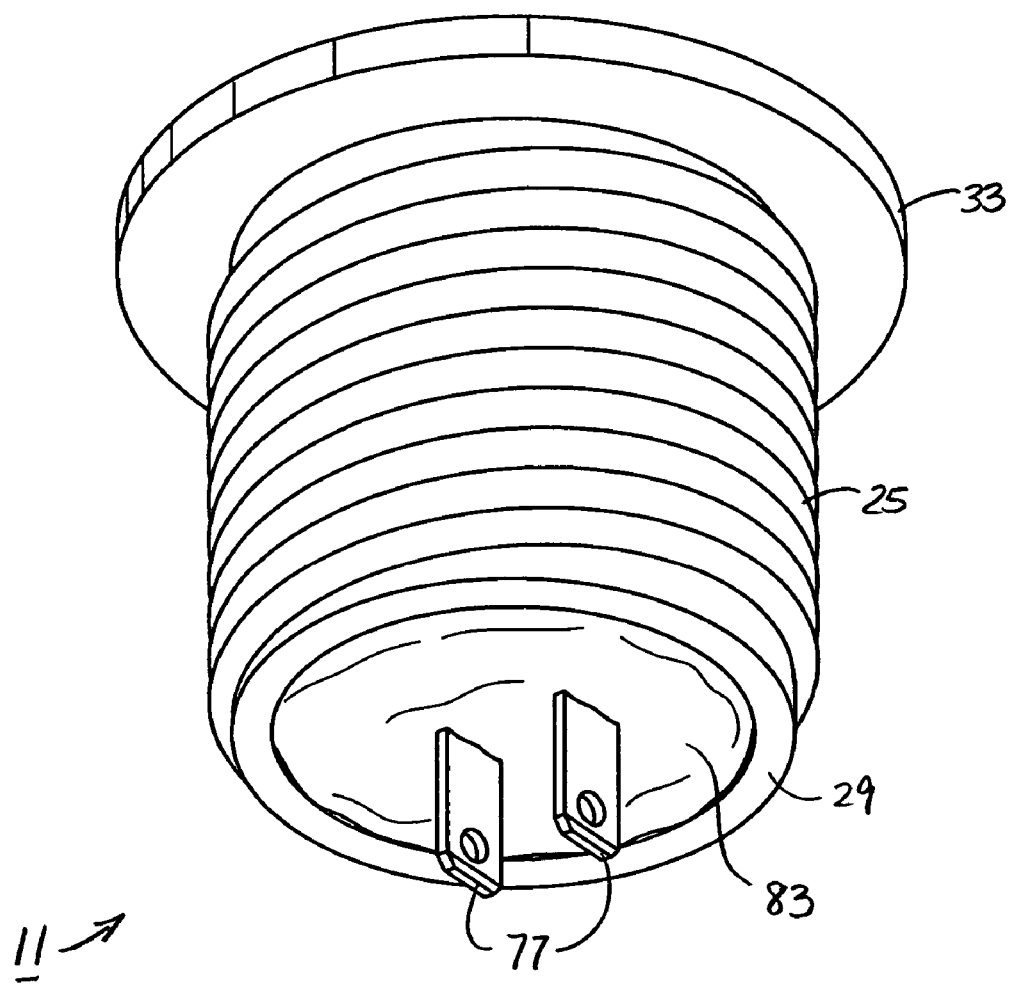
FIG. 1 is a bottom perspective view of a piezoelectric switch assembly constructed according to the teachings of the present invention.

Referring now to FIG. 1, there is shown a piezoelectric switch that is constructed according to the teachings of the present invention, the piezoelectric switch being identified generally by reference numeral 11.

Figures 2, 2A:
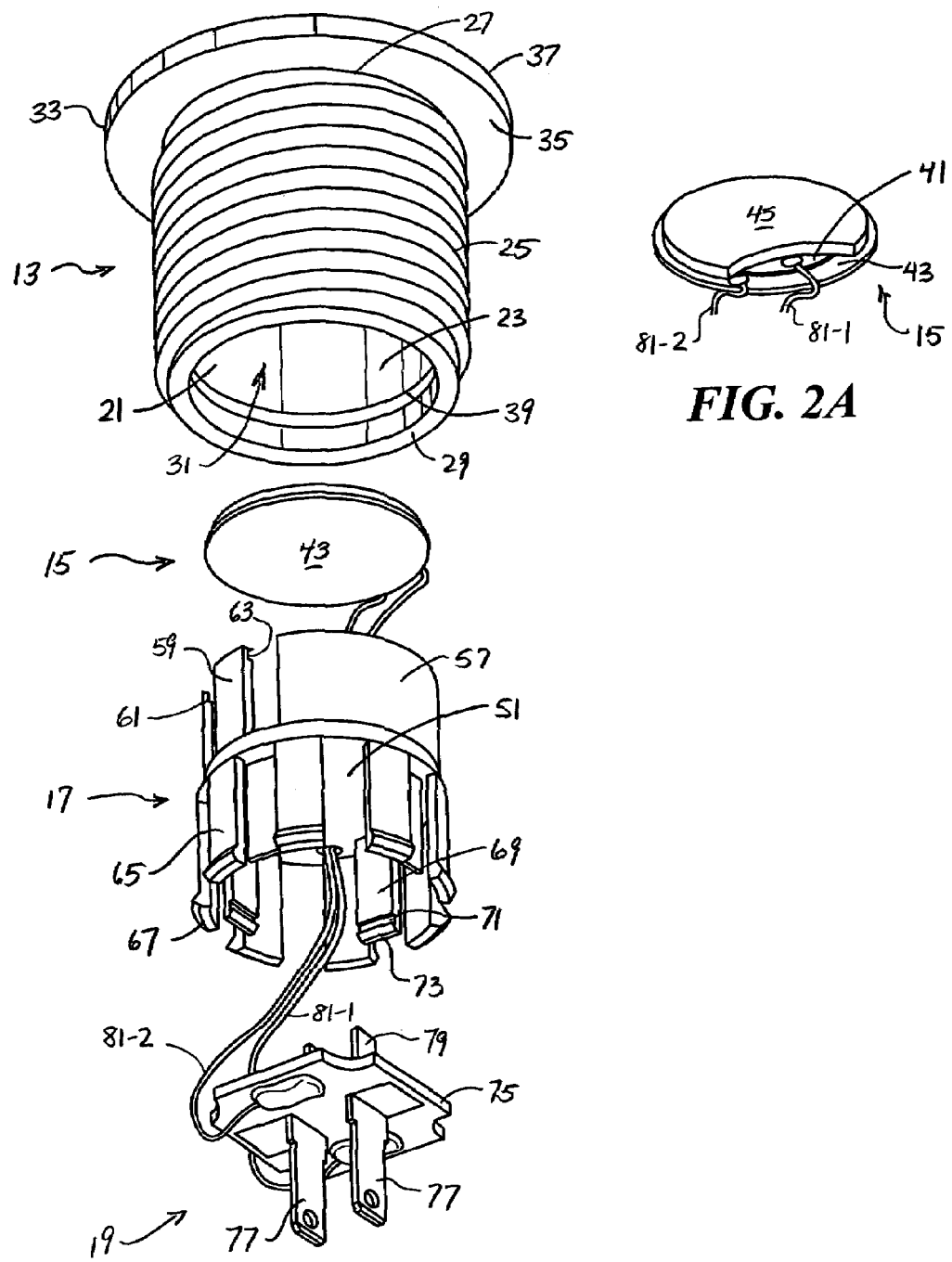
FIG. 2 is an exploded perspective view of the piezoelectric switch shown in FIG. 1, the piezoelectric switch being shown with the potting material removed.
FIG. 2A is a fragmentary, top perspective view of the piezoelectric element shown in FIG. 2, the piezoelectric element being shown with a pair of wires connected thereto.

Referring now to FIG. 2, piezoelectric switch 11 comprises a housing 13, a piezoelectric element 15, a carrier 17 and a printed circuit board assembly 19.

Housing 13 is a unitary member that is preferably constructed out of a rigid and durable material, such as plastic or aluminum. Housing 13 comprises a cylindrical wall 21 which includes an inner surface 23, an outer surface 25, a first end 27 and a second end 29 which together define a partially-enclosed interior cavity 31 which is sized and shaped to receive the remaining components of piezoelectric switch 11, as will be described in detail below.

An enlarged disc-shaped touch plate, or button, 33 is integrally formed onto first end 27 of cylindrical wall 21, touch plate 33 comprising an inner surface 35 and an outer surface 37. Preferably, the outer diameter of touch plate 33 is slightly greater than the outer diameter of cylindrical wall 21 in order to enclose first end 27 of cylindrical wall 21. As will be described further below, the central portion of outer surface 37 serves as the contact surface for manually activating switch 11.

Outer surface 25 of cylindrical wall 21 is preferably threaded along the majority of its length. As a result, housing 13 (and, in turn, the entire switch 11) can be screwed into a corresponding threaded hole formed in the device in which switch 11 is to be installed.

An annular groove 39 is formed in inner surface 23 of housing 13 at a location proximate second end 29. As will be described further below, a portion of carrier 17 is designed to snap-fit into engagement within groove 39 in order to retain carrier 17 securely within interior cavity 31.

As seen most clearly in FIG. 2A, piezoelectric element 15 comprises a disc-shaped piezoelectric plate 41 which is affixed onto a disc-shaped conductive plate 43 by an adhesive (not shown), the outer diameter of conductive plate 43 being slightly greater than the outer diameter of piezoelectric plate 41. Piezoelectric plate 41 is preferably constructed out of piezo crystal and serves as the positive terminal for switch 11. Conductive plate 43 is preferably constructed out of a conductive metal, such as brass, and serves as the negative terminal for switch 11.

Figure 8:
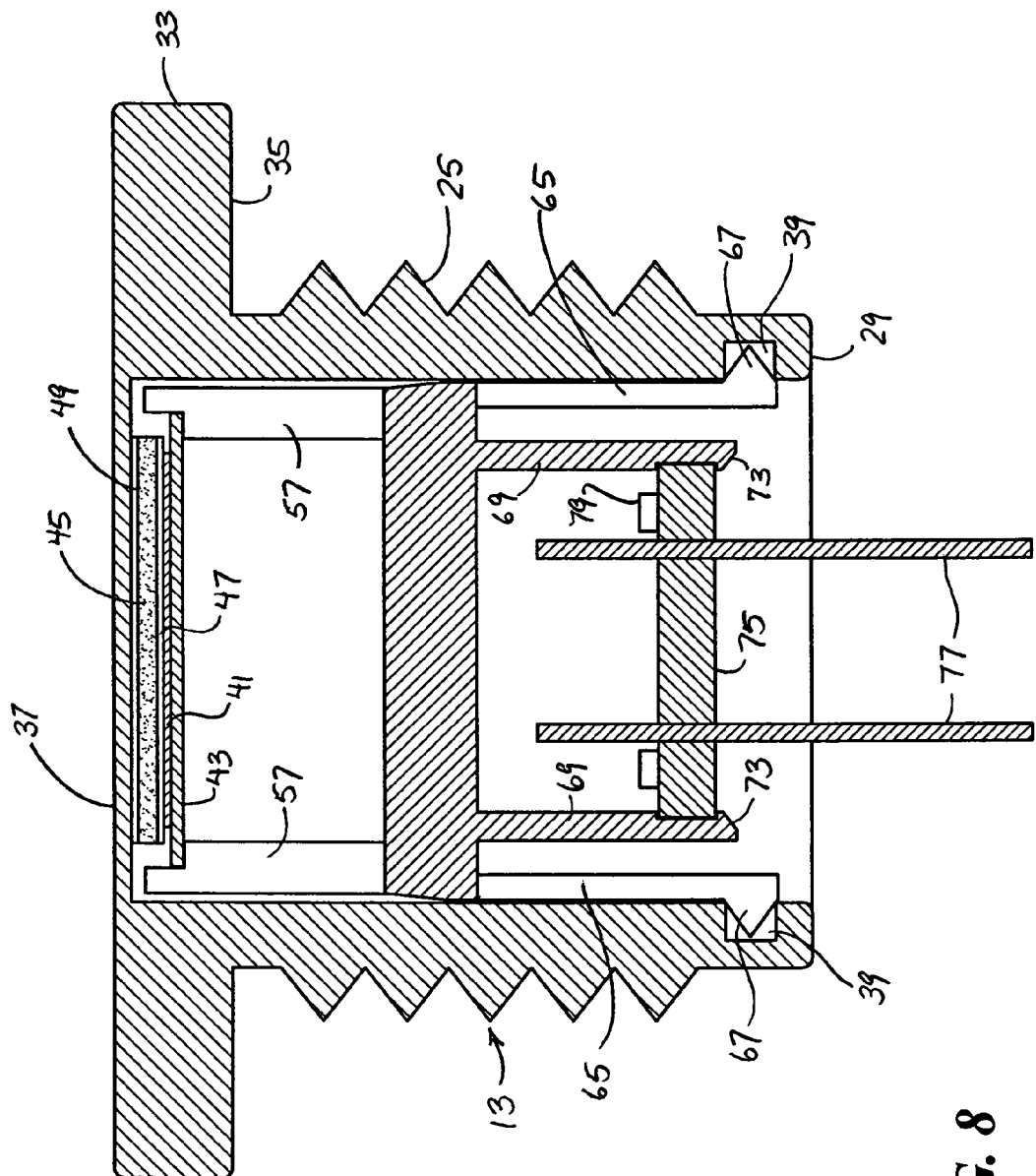
FIG. 8 is a section view of the piezoelectric switch shown in FIG. 7 taken along lines 7-7, the piezoelectric switch being shown with the wires removed for greater ease in viewing.

A disc-shaped spacer 45 constructed out a deformable and non-conductive material (e.g., foam) is mounted on the free surface of piezoelectric plate 41 by an adhesive layer 47 (as seen most clearly in FIG. 8). Furthermore, the free surface of spacer 45 is coated with an additional adhesive layer 49 which enables spacer 45 to be affixed against inner surface 35 of touch plate 33. Accordingly, spacer 45 serves two principal functions: (1) as a means for securing piezoelectric element 15 against inner surface 35 of touch plate 33 so as to enable a suitable input force applied onto outer surface 37 of touch plate 33 to, in turn, stimulate piezoelectric plate 41 and (2) as a means for spacing piezoelectric element 15 slightly away from touch plate 33 so as to minimize the possibility of piezoelectric plate 41 being unintentionally stimulated by thermal influences present in the environment immediately surrounding housing 13.

Carrier 17 is a unitary member that is constructed out of a suitably rigid plastic material, such as LEXAN 241. As will be described further below, the particular design and function of carrier 17 within switch 11 serves as the principal novel feature of the present invention.

Figure 4:
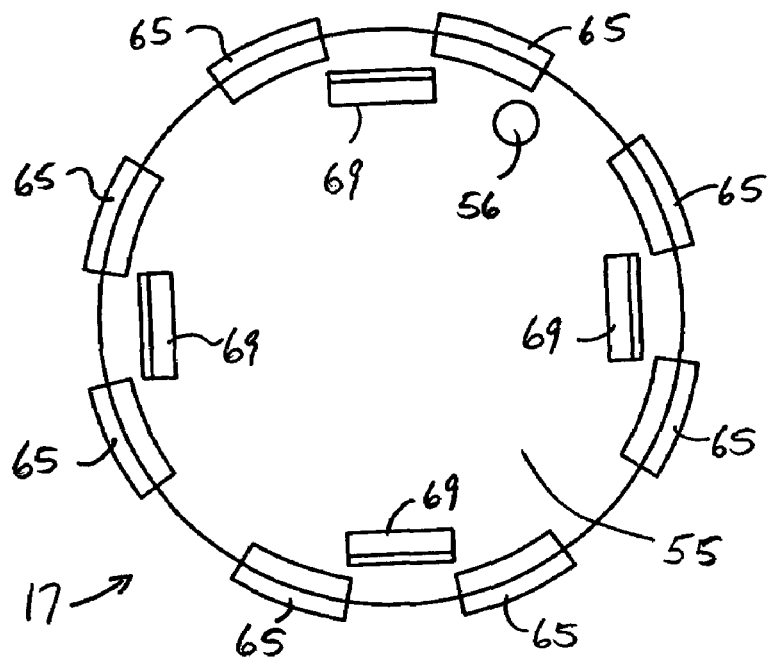
FIG. 4 is a bottom plan view of the carrier shown in FIG. 2.
Figure 3:
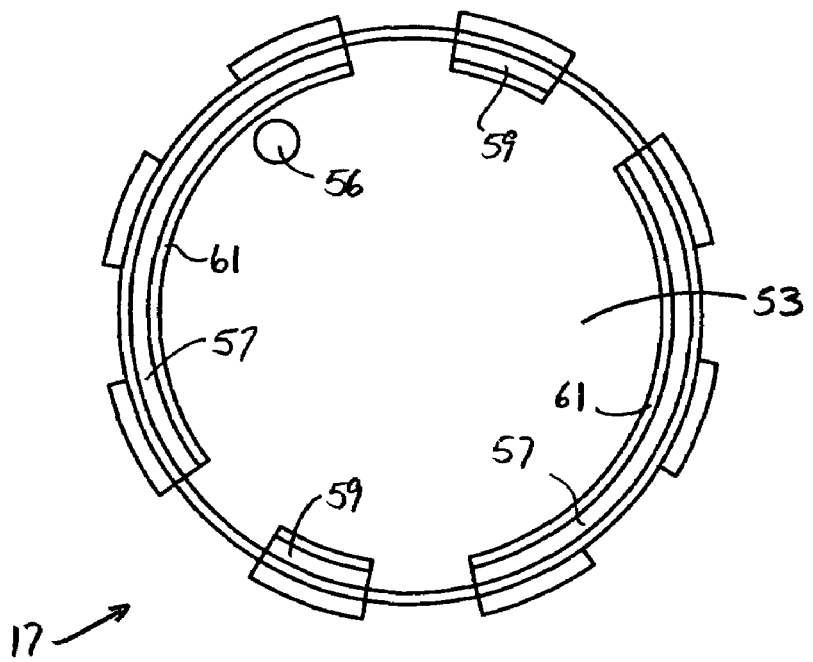
FIG. 3 is a top plan view of the carrier shown in FIG. 2.

Referring now to FIGS. 2-4, carrier 17 comprises a central, disc-shaped support plate 51 that includes a top surface 53 and a bottom surface 55. A small circular hole 56 is formed in support plate 51 and is sized and shaped to allow for a pair of conductive wires to pass therethrough, as will be described further below.

As seen most clearly in FIGS. 2 and 3, a pair of opposing, arcuately shaped support walls 57 is integrally formed onto top surface 53 in a spaced apart relationship along the outer periphery of support plate 51. In addition, a pair of flexible fingers 59 is integrally formed onto top surface 53 along the outer periphery of support plate 51, with one flexible finger 59 being disposed equidistantly between each adjacent pair of free ends for support walls 57, as seen most clearly in FIG. 6.

Together, support walls 57 and flexible fingers 59 are designed to support piezoelectric element 15 along the majority of its outer periphery, which is a principal object of the present invention. Specifically, as seen most clearly in FIG. 3, each support wall 57 is provided with an L-shaped notch 61 at its free end which is sized and shaped to support a portion of the outer periphery of conductive plate 43. In addition, each flexible finger 59 is provided with a narrow slot 62 proximate its free end which is sized and shaped to receive a portion of conductive plate 43. Furthermore, each flexible finger 59 is provided with an outwardly extending, ratchet-shaped tooth, or pawl, 63 at its free end which serves help retain conductive plate 43 of piezoelectric element 13 in place within slot 62, as will be described further in detail below.

As seen most clearly in FIGS. 2 and 4, a plurality of flexible fingers 65 is integrally formed onto bottom surface 55 in a spaced apart relationship along the outer periphery of support plate 51, each finger 65 extending generally orthogonally away from bottom surface 55. The free end of each finger 65 is shaped to include an outwardly extending, ratchet-shaped tooth, or pawl, 67. As will be described further in detail below, pawl 67 of each flexible finger 65 is designed to engage within annular groove 39 so as retain carrier 17 fixed in place within interior cavity 31 of housing 13.

Carrier 17 is represented herein as comprising eight flexible fingers 65 which are equidistantly spaced along the outer periphery of the bottom surface 55 of support plate 51. However, it is to be understood that the number and/or configuration of flexible fingers 65 could be modified without departing from the spirit of the present invention.

Furthermore, a plurality of flexible fingers 69 is integrally formed onto bottom surface 55 in a spaced apart relationship, each finger 69 extending generally orthogonally away from bottom surface 55. Flexible fingers 69 are spaced slightly in from the outer periphery of support plate 51. In this manner, fingers 69 define a circular ring which is concentrically within the circular ring defined by fingers 65, as seen most clearly in FIG. 6.

Each flexible finger 69 is provided with a narrow slot 71 proximate its free end which is sized and shaped to receive a portion of the printed circuit board assembly 19. Furthermore, each flexible finger 69 is provided with an outwardly extending, ratchet-shaped tooth, or pawl, 71 at its free end which serves help retain printed circuit board assembly 19 in place within slot 71.

Carrier 17 is represented herein as comprising four flexible fingers 69 which are equidistantly spaced apart from one another. However, it is to be understood that the number and/or configuration of flexible fingers 65 could be modified without departing from the spirit of the present invention.

Referring back to FIG. 2, printed circuit board assembly 19 comprises a thin, generally square-shaped printed circuit board 75, a pair of metal prongs 77 conductively coupled to printed circuit board 75, electronics 79 soldered onto printed circuit board 75 and a pair of conductive wires 81 which electrically connect piezoelectric element 15 to printed circuit board 19. As will be described further below, the input of contact onto piezoelectric element 15 creates an output current which passes from piezoelectric element 15 to printed circuit board 75 via wires 81. In turn, electronics 79 analyzes said output current and, if it meets the minimum threshold, changes the conductive state of switch 11 by either opening or closing the electrical path which passes between conductive prongs 77.

Assembly of Switch 11

Piezoelectric switch 11 is designed for assembly in the following manner. Specifically, spacer 45 and conductive plate 43 are affixed to piezoelectric plate 41 by adhesives to form the unitary piezoelectric element 15 shown in FIG. 2A. Piezoelectric element 15 is then electrically connected to printed circuit board 75 by conductive wires 81. Specifically, a first wire 81-1 electrically connects piezoelectric plate 41 with printed circuit board 75 and a second wire 81-2 electrically connects conductive plate 43 with printed circuit board 75, each of wires 81 being fed through hole 56 in support plate 51 of carrier 17, as shown in FIG. 2.

With piezoelectric element 15 electrically connected to printed circuit board 75, both piezoelectric element 15 and printed circuit board 75 are mounted onto carrier 17 in snap-fit engagement therewith.

Figure 5:
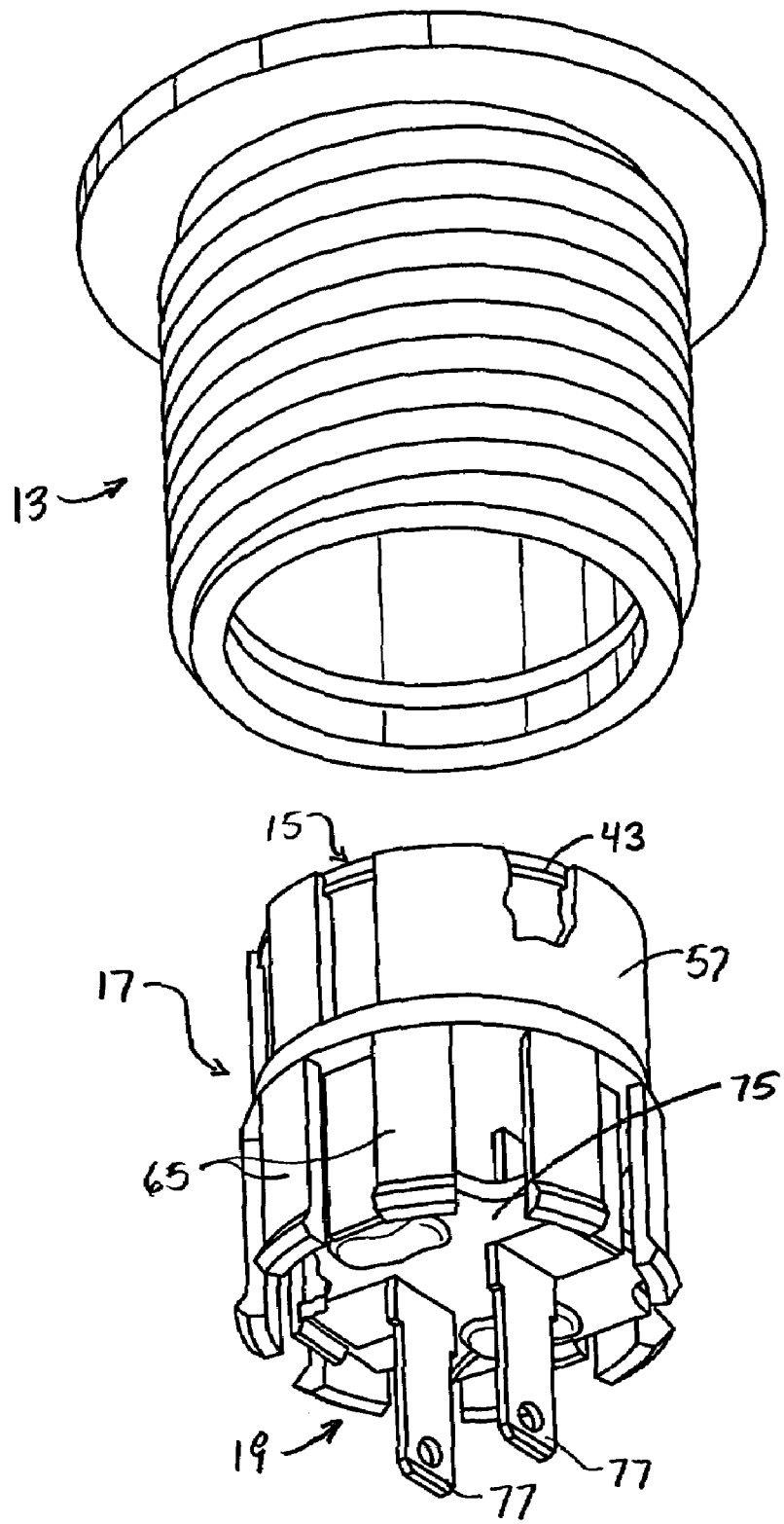
FIG. 5 is a partially assembled, bottom perspective view, broken away in part, of the piezoelectric switch shown in FIG. 2.

Specifically, piezoelectric element 15 is mounted onto carrier 17 in the following manner. With spacer 45 directed away from carrier 17, as shown in FIG. 2, piezoelectric element 15 is urged downward towards carrier 17 until the bottom surface of conductive plate 43 contacts the ratchet-shaped tooth 63 provided on each flexible finger 59. Upon the application of a suitable downward force, conductive plate 43 causes each of fingers 59 to flex slightly outward to the extent necessary such that the majority of the outer periphery of the bottom surface of conductive plate 43 is disposed directly on top of notches 61 formed in arcuate support walls 57. With conductive plate 43 disposed directly on top of notches 61 in support walls 57, flexible fingers 59 resiliently snap back inward such that a portion of the outer periphery of conductive plate 43 aligns within the slot 62 formed in each finger 59, the ratchet-shaped tooth 63 on each finger 59 engaging the top surface of conductive plate 43 so as to retain piezoelectric element 15 securely in place on carrier 17, as shown in FIG. 5.

Similarly, printed circuit board 75 is mounted onto carrier in the following manner. With conductive prongs 77 directed away from carrier 17, as shown in FIG. 2, printed circuit board 75 is urged upwards towards carrier until the top surface of printed circuit board 75 contacts the ratchet-shaped tooth 73 provided on each flexible finger 69. Upon the application of a suitable upward force, printed circuit board 75 causes each of fingers 69 to flex slightly outward to the extent necessary so that the outer periphery of printed circuit board 75 aligns within each slot 71. At this time, flexible fingers 69 resiliently snap back inward with the ratchet-shaped tooth 73 on each finger 69 engaging the bottom surface of printed circuit board 75 so as to retain printed circuit board 75 securely in place on carrier 17, as shown in FIG. 5.

With piezoelectric element 15 and printed circuit board 75 mounted on carrier 17 in the manner as described above and as represented in FIG. 5, carrier 17 is slidably disposed in place within housing 13. Specifically, with conductive prongs 77 directed away from housing 13, carrier 17 is disposed in axial alignment within interior cavity 31 of housing 13. Aligned in this manner, carrier 17 is then urged directly upward.

It should be noted that, as carrier 17 is advanced into cavity 31, fingers 65 on carrier 17 eventually contact second end 29 of housing 13. However, upon the application of a suitable upward force on carrier 17, second end 29 of housing inwardly biases fingers 65 to the extent necessary so that carrier 17 can project into interior cavity 31.

Figure 6:
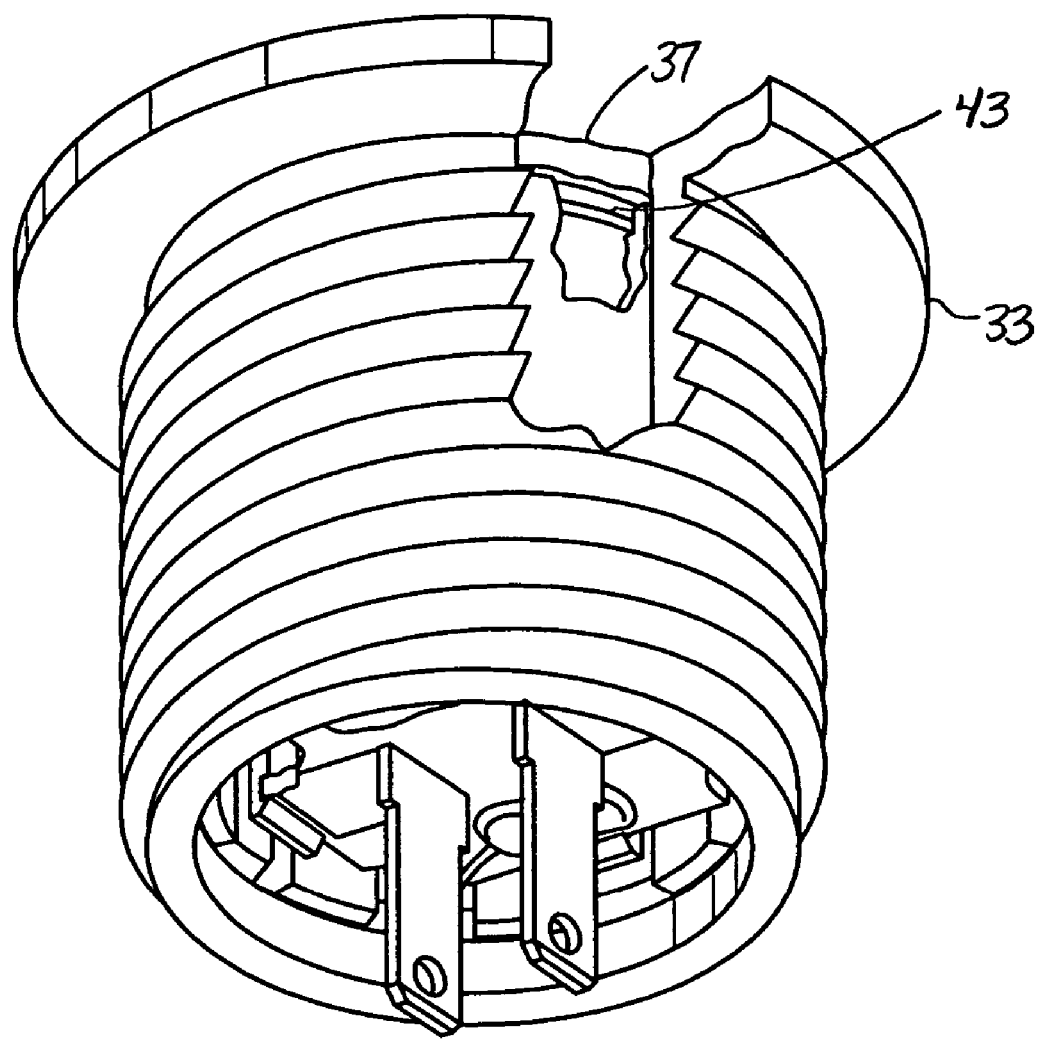
FIG. 6 is a bottom perspective view, broken away in part, of the piezoelectric switch shown in FIG. 1, the piezoelectric switch being shown with the potting material removed.
Figure 7:
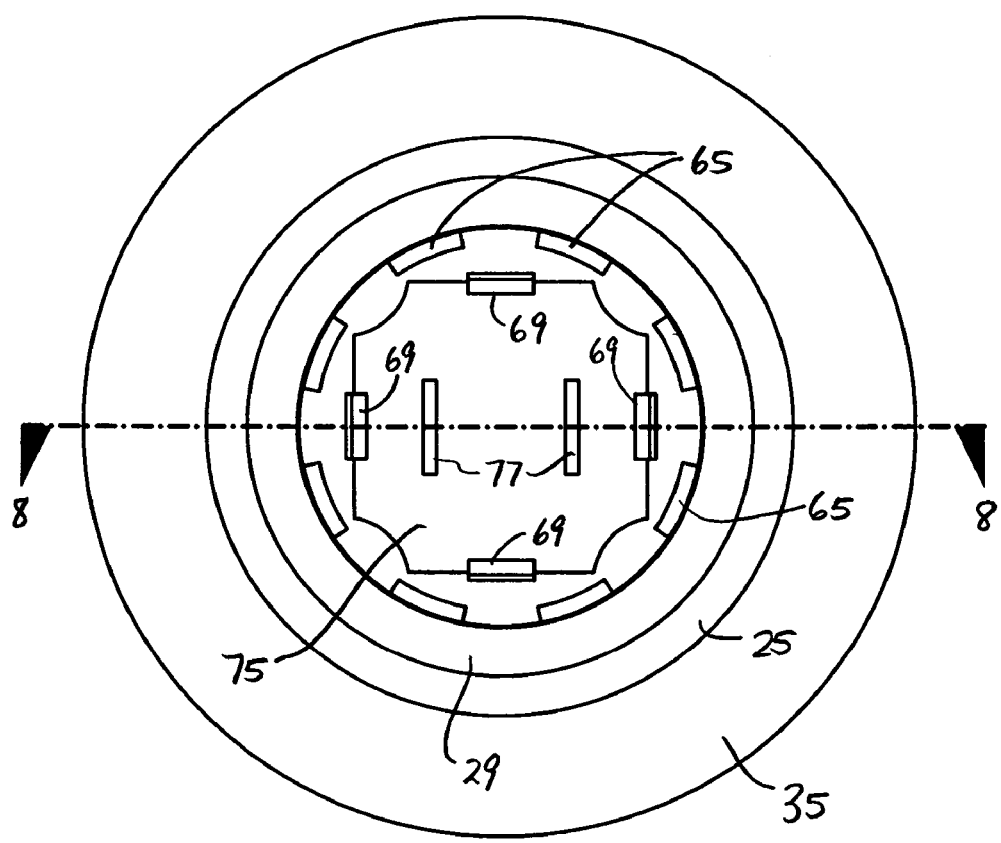
FIG. 7 is a bottom plan view of the piezoelectric switch shown in FIG. 6.

Further advancement of carrier 17 into cavity 31 ultimately causes adhesive layer 49 on the free end of spacer 45 to contact the inner surface 23 of housing 13, thereby securing piezoelectric element 15 in place within housing 13, as shown in FIG. 8. At the same time, the ratchet-shaped tooth 67 on each finger 65 aligns within annular groove 39 formed in housing 13. As a result, each finger 65 resiliently snaps outward such that each tooth 67 projects into groove 39, thereby securing carrier 17 in place within cavity 31, as shown in FIG. 6.

With carrier 17 (as well as piezoelectric element 15 and printed circuit board assembly 19) secured in place within interior cavity 31 of housing 13, a supply of potting material 83 such as silicon is preferably deposited into cavity 31 in order to enclose the open second end 29 of housing 13, as shown in FIG. 1. In this manner, potting material 83 serves to seal off open second end 29 of housing 13, thereby protecting the electrical components of switch 11 (i.e., piezoelectric element 15 and printed circuit board assembly 19) from any potentially harmful environmental conditions, such as moisture.

As such, it is readily apparent carrier 17 serves two principal functions: (1) to retain piezoelectric element 15 fixed in place within housing 13 and (2) to retain printed circuit board 75 fixed in place within housing 13. Because carrier 17 is designed as a separate piece from housing 13 which can be easily snap-fit into place within interior cavity 31, it is to be understood that carrier 17 renders piezoelectric switch 11 considerably less labor-intensive to assemble than most traditional piezoelectric switches, which is highly desirable.

It should also be noted that the particular design of carrier 17 provides a high-level of support to piezoelectric element 15 along the majority of its outer periphery. As a result, even if adhesive layer 47 were to weaken over time, carrier 17 ensures that the application of a suitable force on outer surface 37 of touch plate 33 directs the deformation of piezoelectric plate 41 towards its center rather than along its outer periphery, thereby optimizing the success rate of switch 11, which is highly desirable.

Operation of Switch 11

With piezoelectric switch 11 assembled in the manner noted above, conductive prongs 77 of printed circuit board assembly 19 are electrically connected to the electrical circuit to be regulated by switch 11. As noted briefly above, the threading provided on outer surface 25 of housing 13 enables switch 11 to be screwed in place within a corresponding threaded bore (e.g., provided in a panel for the device to be regulated by switch 11).

With switch 11 electrically connected to a particular electrical circuit, it is to be understood that the application of a suitable contact force on outer surface 37 of button-shaped touch plate 33 in turn travels through spacer 45 and deforms the approximate center of piezoelectric plate 41. This deformation causes piezoelectric plate 41 to generate an output signal which is passed to printed circuit board 75 via wire 81-1.

Electronics 79 are responsible for analyzing the output signal to determine whether it meets the minimum threshold. If the output signal is sufficient, electronics 79 opens or closes switch 11 (depending on its natural state). As a result, switch 11 serves to regulate the control of current between prongs 77 and, in turn, the electric circuit to which switch 11 is connected.

The embodiments shown in the present invention are intended to be merely exemplary and those skilled in the art shall be able to make numerous variations and modifications to them without departing from the spirit of the present invention. All such variations and modifications are intended to be within the scope of the present invention as defined in the appended claims.

What is claimed is:

1. A piezoelectric switch comprising:
   (a) a housing shaped to define an interior cavity, the housing including a touch plate which comprises an inner surface and an outer surface, the outer surface of the touch plate being accessible for tactile input,
   (b) a piezoelectric element, the piezoelectric element comprising a piezoelectric plate and a conductive plate, the piezoelectric element being characterized by generating an electrical signal upon its deformation,
   (c) a printed circuit board assembly, the printed circuit board assembly comprising a printed circuit board that is electrically connected to the piezoelectric element, wherein deformation of the piezoelectric plate produced by applying downward pressure to outer surface of the touch plate causes the piezoelectric element to generate an electrical signal which passes to the printed circuit board, and
   (d) a carrier for holding the piezoelectric element and for retaining the printed circuit board, the carrier being separate from the housing, the carrier being sized and shaped to fit within the interior cavity of the housing,
   (e) wherein the carrier is designed to engage the housing to retain the carrier fixed in place within the interior cavity such that the piezoelectric element is coupled to the inner surface of the touch plate.

2. The piezoelectric switch as claimed in claim 1 wherein the carrier engages at least a portion of the outer periphery of the conductive plate in order to retain the piezoelectric element fixedly mounted on the carrier.

3. The piezoelectric switch as claimed in claim 1 wherein the housing comprises a generally cylindrical wall which includes an inner surface, an outer surface, a first end and a second end.

4. The piezoelectric switch as claimed 3 wherein the touch plate is integrally formed onto first end of the cylindrical wall.

5. The piezoelectric switch as claimed in claim 3 further comprising potting material disposed in the interior cavity of the housing in such a manner so as to hermetically seal off the second end of the cylindrical wall.

6. The piezoelectric switch as claimed in claim 1 wherein the carrier includes a plurality of flexible fingers which engage at least a portion of the outer periphery of the printed circuit board in order to retain the printed circuit board fixedly mounted on the carrier.

7. The piezoelectric switch as claimed in claim 1 wherein the piezoelectric element is connected to the inner surface of the touch plate through a non-conductive spacer.

8. The piezoelectric switch as claimed in claim 7 wherein the piezoelectric plate and the conductive plate are affixed together by an adhesive.

9. The piezoelectric switch as claimed in claim 8 wherein the piezoelectric element is connected to the printed circuit board by a pair of conductive wires.

10. A piezoelectric switch comprising:
   (a) a housing shaped to define an interior cavity, the housing including a touch plate which comprises an inner surface and an outer surface, the outer surface of the touch plate being accessible for tactile input,
   (b) a piezoelectric element, the piezoelectric element comprising a piezoelectric plate and a conductive plate, the piezoelectric element being characterized by generating an electrical signal upon its deformation,
   (c) a printed circuit board assembly, the printed circuit board assembly comprising a printed circuit board that is electrically connected to the piezoelectric element, and
   (d) a carrier sized and shaped to fit within the interior cavity of the housing, the carrier being separate from the housing, the carrier comprising
      (i) a first set of flexible fingers for retaining the piezoelectric element fixedly mounted on the carrier,
      (ii) a second set of flexible fingers for retaining the carrier fixed in place within the interior cavity of the housing such that the piezoelectric element is coupled to the inner surface of the touch plate, and
      (iii) a third set of flexible fingers for retaining the printed circuit board fixedly mounted on the carrier.

11. A piezoelectric switch comprising:
   (a) a housing shaped to define an interior cavity, the housing including a touch plate which comprises an inner surface and an outer surface, the outer surface of the touch plate being accessible for tactile input,
   (b) a piezoelectric element, the piezoelectric element comprising a piezoelectric plate and a conductive plate, the piezoelectric element being characterized by generating an electrical signal upon its deformation,
   (c) a printed circuit board assembly, the printed circuit board assembly comprising a printed circuit board that is electrically connected to the piezoelectric element, wherein deformation of the piezoelectric plate produced by applying downward pressure to the outer surface of the touch plate causes the piezoelectric element to generate an electrical signal which passes to the printed circuit board, and
   (d) a carrier for holding the piezoelectric element, the carrier engaging at least a portion of the outer periphery of the conductive plate in order to retain the piezoelectric element fixedly mounted on the carrier, the carrier being separate from the housing, the carrier being sized and shaped to fit within the interior cavity of the housing, the carrier comprising,
      (i) at least one wall for supporting the piezoelectric element, and
      (ii) at least one flexible finger for retaining the piezoelectric element fixed in place on the at least one wall,
   (e) wherein the carrier is designed to engage the housing to retain the carrier fixed in place within the interior cavity such that the piezoelectric element is coupled to the inner surface of the touch plate.

12. The piezoelectric switch as claimed in claim 11 wherein the at least one flexible finger includes a tooth which is designed to snap-fit into engagement with the piezoelectric element.

13. A piezoelectric switch comprising:
   (a) a housing comprises a generally cylindrical wall which includes an inner surface, an outer surface, a first end and a second end which together define an interior cavity, the housing including a touch plate that is integrally formed onto the first end of the cylindrical wall, the touch plate comprising an inner surface and an outer surface, the outer surface of the touch plate being accessible for tactile input, wherein an annular groove is formed in the inner surface of the housing,
   (b) a piezoelectric element, the piezoelectric element comprising a piezoelectric plate and a conductive plate, the piezoelectric element being characterized by generating an electrical signal upon its deformation,
   (c) a printed circuit board assembly, the printed circuit board assembly comprising a printed circuit board that is electrically connected to the piezoelectric element, wherein deformation of the piezoelectric plate produced by applying downward pressure to the outer surface of the touch plate causes the piezoelectric element to generate an electrical signal which passes to the printed circuit board, and
   (d) a carrier for holding the piezoelectric element, the carrier being separate from the housing, the carrier being sized and shaped to fit within the interior cavity of the housing,
   (e) wherein the carrier is designed to engage the housing to retain the carrier fixed in place within the interior cavity such that the piezoelectric element is coupled to the inner surface of the touch plate.

14. The piezoelectric switch as claimed in claim 13 wherein the outer surface of the cylindrical wall is threaded along at least a portion of its length.

15. The piezoelectric switch as claimed in claim 13 wherein the carrier comprises at least one flexible finger which is sized and shaped to snap-fit into engagement within the annular groove in the housing in such a manner so as to retain the carrier fixed in place within the interior cavity of the housing.

* * * * *